(12) United States Patent
Sommer et al.

(10) Patent No.: US 7,016,244 B2
(45) Date of Patent: Mar. 21, 2006

(54) METHOD AND ARRANGEMENT FOR TESTING OUTPUT CIRCUITS OF HIGH SPEED SEMICONDUCTOR MEMORY DEVICES

(75) Inventors: Stefan Sommer, Fuerth (DE); Wolfgang Spirkl, Germering (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/843,383

(22) Filed: May 12, 2004

(65) Prior Publication Data

US 2005/0030781 A1 Feb. 10, 2005

(30) Foreign Application Priority Data

May 13, 2003 (DE) ................................ 103 21 467

(51) Int. Cl.
*G11C 7/00* (2006.01)
(52) U.S. Cl. ...................................... 365/201; 365/233
(58) Field of Classification Search .............. 365/201, 365/233; 714/718
See application file for complete search history.

(56) References Cited

U.S. PATENT DOCUMENTS

| 5,592,493 A | * | 1/1997 | Crouch et al. ............... 714/729 |
| 5,821,786 A | * | 10/1998 | Nozuyama et al. ......... 327/141 |
| 6,560,147 B1 | * | 5/2003 | Yoshiyama ............ 365/189.05 |
| 2003/0058165 A1 | | 3/2003 | Whetsel, Jr. |

* cited by examiner

*Primary Examiner*—Anh Phung
(74) *Attorney, Agent, or Firm*—Slater & Matsil, L.L.P.

(57) ABSTRACT

For testing or for characterizing output drivers of output circuits of high-speed semiconductor memory devices under conditions close to an application, scan elements are provided at the inputs of the output circuits. The scan elements in each case have a register function and are cascaded to form a scan chain. Via the scan chain, test data signals are applied to the inputs of the output circuits whilst bypassing a memory cell array of the semiconductor memory devices. The characterization of data signals of the high-speed semiconductor memory devices that are output by the output circuits requires only a test memory controller not connected to the data signal terminals and a passive load simulation of the application memory controller.

17 Claims, 7 Drawing Sheets

METHOD AND ARRANGEMENT FOR TESTING OUTPUT CIRCUITS OF HIGH SPEED SEMICONDUCTOR MEMORY DEVICES

FIELD

The present invention relates generally to semiconductor devices and in particular to a test method for output circuits of a semiconductor memory device.

BACKGROUND

In data processing apparatus such as PCs, servers, graphics cards and mobile telephones, data are stored in semiconductor devices and processed by a memory controller. The data are transferred between the memory controller and the semiconductor devices assigned to the memory controller via a plurality of data signal lines arranged to form a data bus. The data transfer is controlled by the memory controller by means of control and address signal lines, which form a control bus and an address bus, respectively. The performance of a data processing apparatus is substantially determined by a transfer speed or data transfer rate at which the data are transferred on the data bus.

Higher data transfer rates are accompanied by an increase in the requirements made of the formation of the data signal lines and made of output drivers (off chip drivers, or OCDs) by output circuits of the semiconductor memory devices, which output, or drive, the data as data signals on the data bus. Since parasitic capacitances, inductances, resistances and reflection points formed in the course of the data signal lines, as well as circuits connected to the data bus can influence such features as delay and response times, edge gradient and data signal levels, it is desirable to characterize the output circuits in a test environment that simulates a later application as precisely as possible. A memory controller is usually required for the operation of the semiconductor memory device in the test environment.

Semiconductor memory devices and the memory controllers which control the semiconductor memory devices are developed largely in parallel. Therefore, the actual memory controllers with which the semiconductor memory devices are to be operated in an actual application may not be available during a characterization phase of the output drivers or output circuits of the semiconductor memory device. However, a test of the output drivers of the semiconductor memory devices that is close to the application requires a test environment with a memory controller that can operate the semiconductor devices in an environment close to the application.

Therefore, in conventional methods for characterizing output drivers of semiconductor memory devices in an environment close to the application, as is explained below with reference to FIG. 2, the semiconductor memory devices are operated by a test memory controller, while an application memory controller is only simulated passively.

FIG. 2 shows two semiconductor memory devices 1, containing output circuits 14 to be characterized. The semiconductor memory devices 1 are in each case connected to a test memory controller 21 via a control bus CMD and an address bus ADR. Output circuits 14 are in each case connected to a data signal terminal 13. The data bus DQ is connected to data signal terminals 13. In a switch position A of a switching device 24, the data bus DQ of semiconductor memory devices 1, of which an individual data signal DQ is illustrated, is connected to memory controller 21. In a switch position B of switching device 24, test memory controller 21 is disconnected from the data bus DQ of semiconductor memory devices 1. Instead, the data bus DQ is connected to a load simulation 23 via a connecting line 22. In this case, the load properties of connecting line 22 and load simulation 23 correspond to those of an application memory controller in an application.

For tests or for the characterization of output circuits 14, firstly, in the switch position A of the switching device 24, test data are written to memory cells 11, 12 of semiconductor memory devices 1 by means of test memory controller 21. Switching device 24 is switched over to position B and, via the control bus CMD and the address bus ADR, semiconductor memory device 1 is stimulated for outputting the test data at data signal terminals 13. In this case, test circuitry, comprising connecting line 22 and load simulation 23, simulates a later application with an application memory controller that is not yet available or can be programmed in complex fashion. By means of a measuring head 25, measurement signals are coupled out from the data signals DQ driven by output circuits 14 and are transferred to a test data evaluation device 26.

Such characterization of output circuits is necessary in particular for a semiconductor memory device with a double data rate interface (DDR-IF). In the case of semiconductor memory devices with a DDR-IF, data is transferred both upon the rising edge and upon the falling edge of a clock signal. The data transfer rate is thus doubled for the same clock frequency.

As illustrated in a simplified manner in FIG. 1, an output circuit 14 of a semiconductor memory device with a DDR-IF is simultaneously fed, at the input, a first data signal RDATA from a first memory cell 11 and a second data signal FDATA from a second memory cell 12. The data RDATA and FDATA are read from the memory cells 11, 12 synchronously with a clock signal CLK of the semiconductor memory device. Furthermore, a strobe signal STR is derived from the clock signal CLK. A strobe pulse is generated at STR essentially synchronously with each edge at CLK. The output signal of output circuit 14 is a data signal DQ, which is output at a data signal terminal 13 of the semiconductor memory device. The assignment of the data signal DQ to one of the two input signals RDATA or FDATA changes with each strobe pulse at STR.

One disadvantage of the test construction illustrated in FIG. 2 is the fact that writing access to a memory cell array with memory cells 11, 12 of semiconductor memory device 1 is necessary. This always requires at least temporary connection of the test memory controller 21 to the data bus DQ, whereby a result of a characterization measurement is corrupted, however. Moreover, switching device 24 for disconnecting test memory controller 21 or for connecting a load simulation 23 of an application memory controller already substantially alters the result of the characterization measurement.

SUMMARY

Embodiments of the present invention provide a test method which enables a characterization of output circuits of high-speed semiconductor devices without writing access to a memory cell array of the semiconductor memory devices. Other embodiments of the present invention provide a test arrangement and a circuit arrangement in a semiconductor memory device which enables such a method.

Thus, in an exemplary embodiment of the present invention, a test method for output circuits of semiconductor memory devices, comprises connecting a data signal terminal of the semiconductor memory device linked to an output of the output circuit, to test circuitry. A binary test data signal is in each case applied to inputs of the output circuit, and a data signal generated by the output circuit is evaluated by a test data evaluation device.

In an exemplary embodiment of the present invention, for the duration of the test, the inputs of the output circuits are disconnected from the memory cells. Instead, the inputs of the output circuits are in each case connected to scan elements which, in turn, are connected to a test data source. The test data signals are subsequently made available by the test data source and passed to the inputs of the output circuits via the scan elements.

In another embodiment of the present invention, a circuit for selecting and outputting a data signal of a semiconductor memory device comprises an output circuit which, in an initially known manner, is connected to a data signal terminal of the semiconductor memory device on the output side and to two memory cells of the semiconductor memory device on the input side. In a manner dependent on a strobe signal at a strobe input of the output circuit, a memory data signal output by the first memory cell or a memory data signal output by the second memory cell is switched through onto the data signal terminal by the output circuit. Preferably, the circuit arrangement additionally comprises two scan elements respectively assigned to one of the inputs of the output circuit. By means of the scan elements, in each case one of the inputs of the output circuit is fed a scan data signal, provided by a test data source, in a test mode and the memory data signal of one of the memory cells in an application mode.

In an exemplary embodiment of the present invention, a test arrangement for testing output circuits associated with at least one memory cell of a semiconductor memory device, comprises test circuitry which is in each case connected to a data signal terminal of the semiconductor memory device. The data signal terminal is connected to an output of the output circuit, and a test memory controller. The memory controller controls an operation of the semiconductor memory device in a test mode and for this purpose is connected to control and address signal terminals of the semiconductor memory device to be tested.

Preferably, the semiconductor memory devices to be tested have scan elements as described above. The data signal terminals of the one or more semiconductor memory devices to be tested are in each case connected exclusively to test circuitry having a load simulation of an application memory controller and a connecting line to the load simulation that corresponds to a line portion between the application memory controller and the semiconductor memory device.

DETAILED DESCRIPTION OF THE PREFERRED EMBODIMENTS

The following is a list of symbols that are used consistently throughout the text and drawings.

| | |
|---|---|
| 1 | Semiconductor memory device |
| 11 | Memory cell |
| 12 | Memory cell |
| 13 | Data signal terminal |
| 14 | Output circuit |
| 21 | Test memory controller |
| 22 | Connecting line |
| 23 | Load simulation |
| 24 | Switching device |
| 25 | Measuring head |
| 26 | Test data evaluation device |
| 27 | Distributor device |
| 3 | Test data source |
| 4 | Scan chain |
| 41 | Scan element |
| 42 | Scan element |
| 51 | Register element |
| 52 | Register element |
| 61 | Data selector |
| 62 | Data selector |
| STR | Strobe signal |
| DQ | Data signal |
| RDATA | Memory data signal |
| FDATA | Memory data signal |
| CLK | Clock signal |
| CMD | Control bus |
| ADR | Address bus |
| TEST | Test mode signal |
| SCANIN | Scan data signal |
| SCANOUT | Scan data signal |
| SCLK | Scan clock signal |

Figure 1:
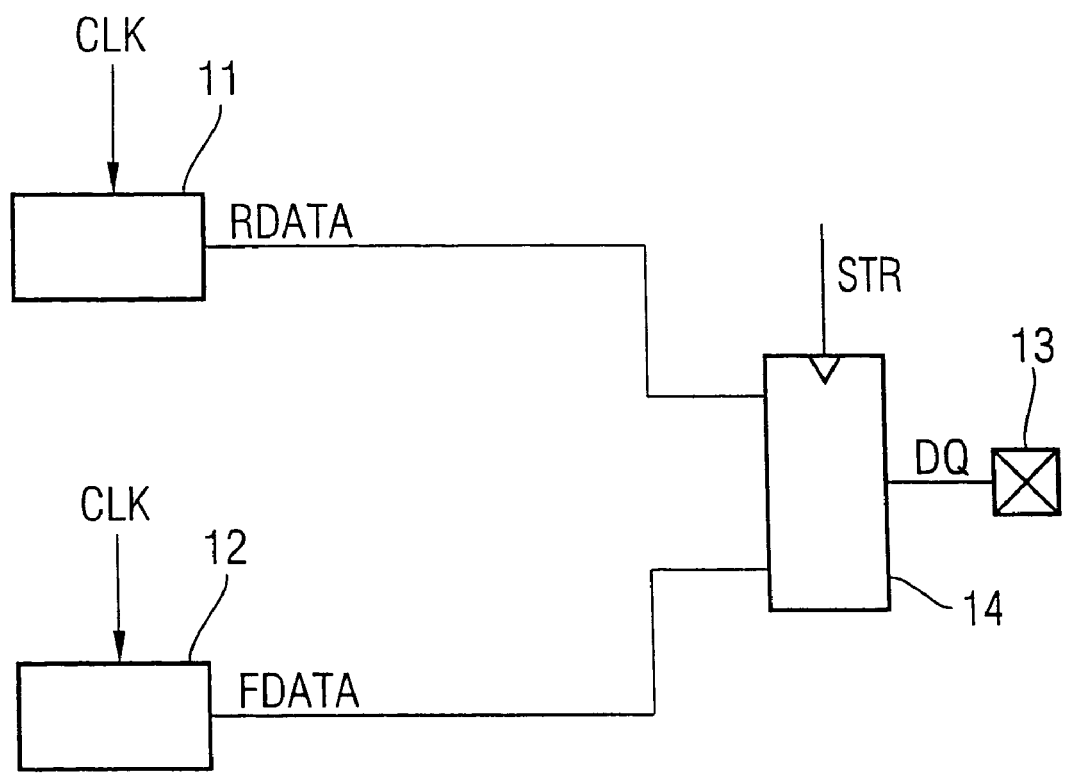
FIG. 1 illustrates a simplified schematic diagram of a circuit arrangement with an output circuit of a semiconductor memory device of a known type.
Figure 2:
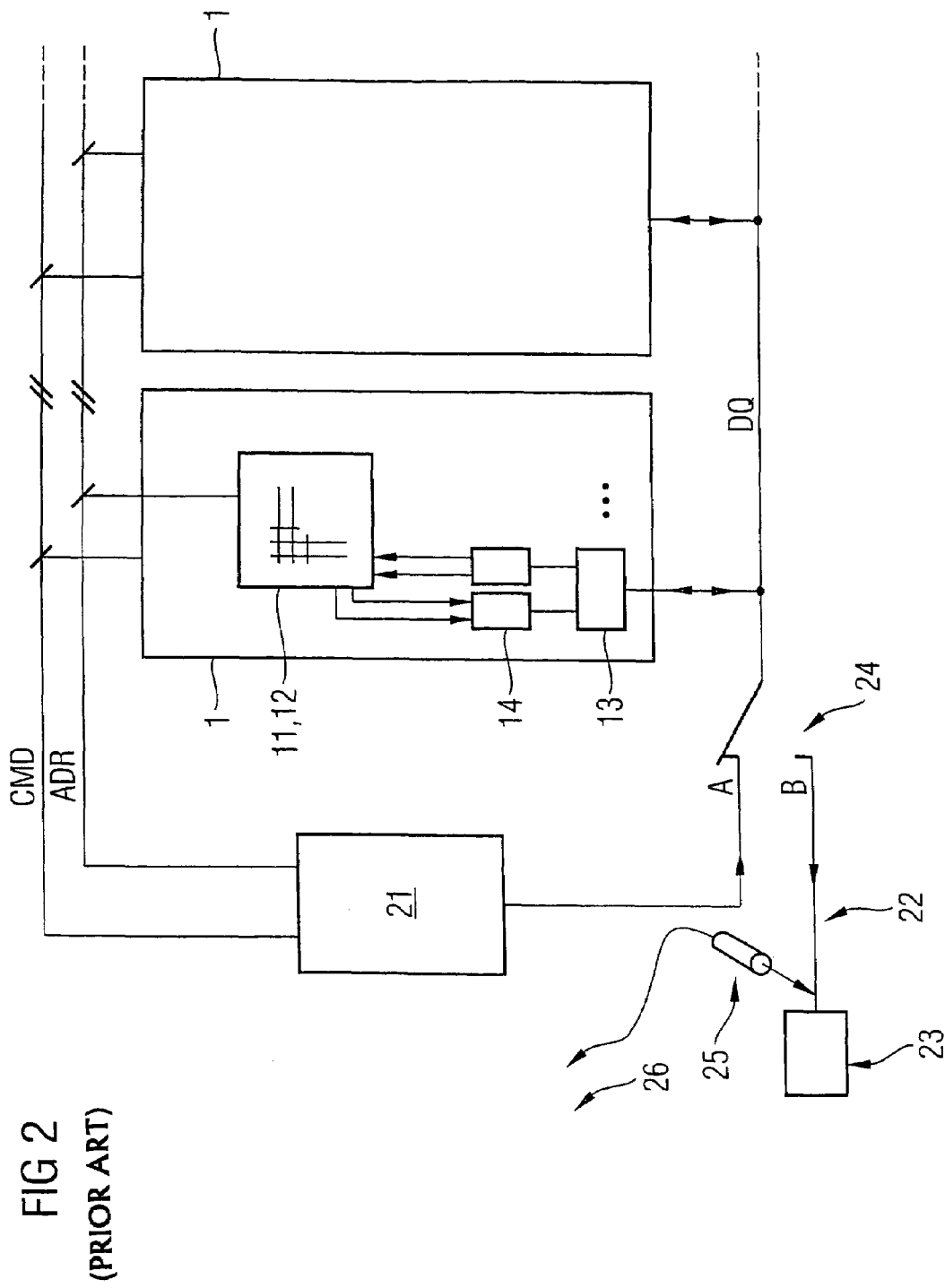
FIG. 2 illustrates a schematic diagram of a test arrangement of a known type for output circuits of semiconductor memory devices.
Figure 3:
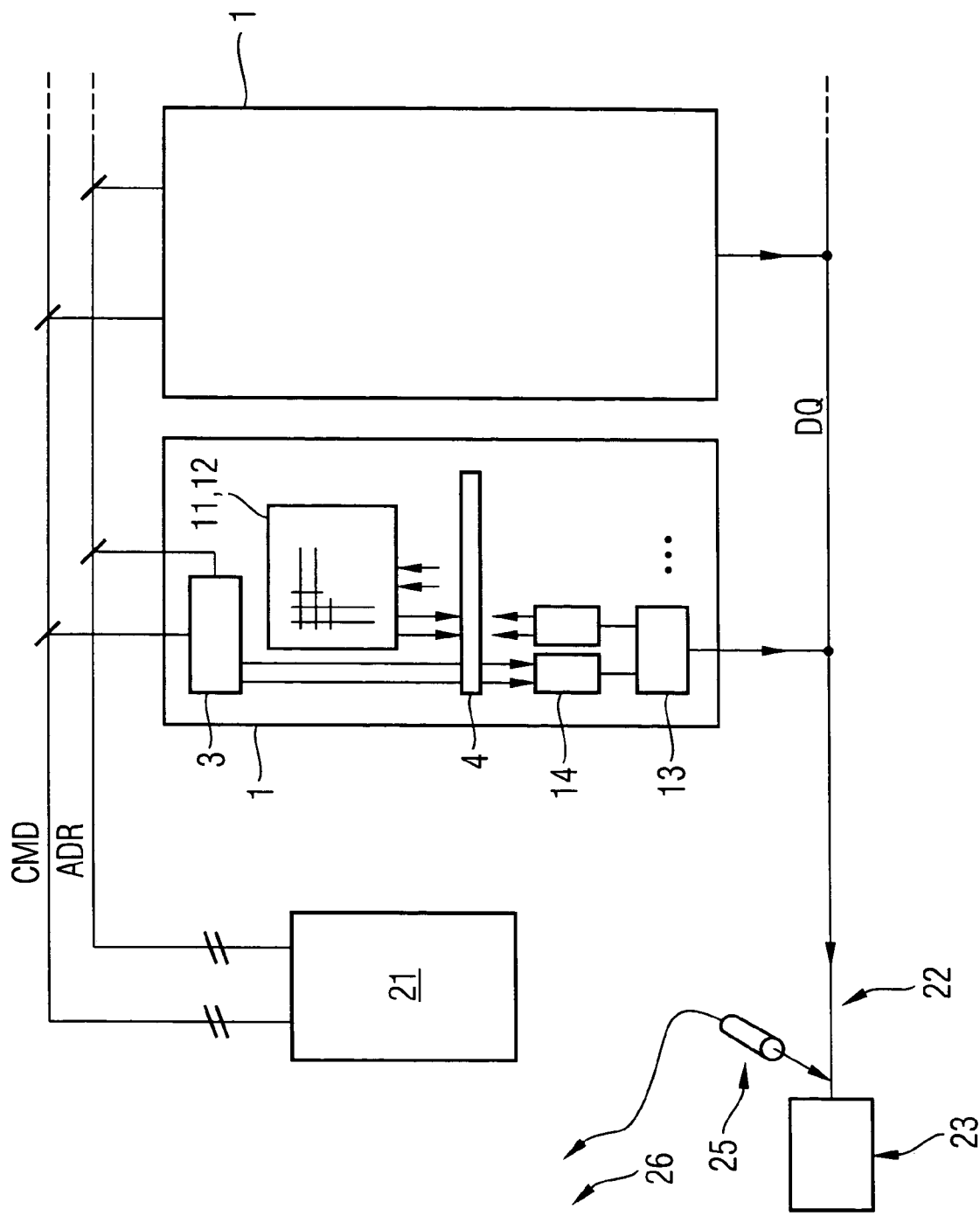
FIG. 3 illustrates a simplified schematic diagram of a test arrangement according an exemplary embodiment of the present invention.

As illustrated in FIG. 3, in a test arrangement for semiconductor memory devices according to an exemplary embodiment of the present invention, in each case one or a plurality of semiconductor memory devices 1 are operated in a test mode by means of a test memory controller 21. In this exemplary embodiment, a test data source 3 provided within the semiconductor memory device 1 is controlled via a control bus CMD and an address bus ADR. Whilst bypassing a memory cell array with memory cells 11, 12, in the test mode, test data source 3 feeds inputs of output circuits 14 via a scan chain 4. The output of output circuits 14 is in each case passed to a data signal terminal 13 of semiconductor memory device 1. Test circuitry formed from a connecting portion 22 and a load simulation of an application memory controller 23 is connected to data signal terminal 13. A data signal DQ output at data signal terminal 13 is usually coupled out at the input of load simulation 23 by means of a measuring head 25, and fed to a test evaluation device 26. Test data evaluation device 26 may be embodied as an oscilloscope, as an apparatus for recording a data eye or as a bit error rate counter device. For application-conforming simulation of a load at data signal terminal 13, or on the data bus, it is also possible to connect further semiconductor memory devices 1 on the same data signal line DQ.

Figure 4:
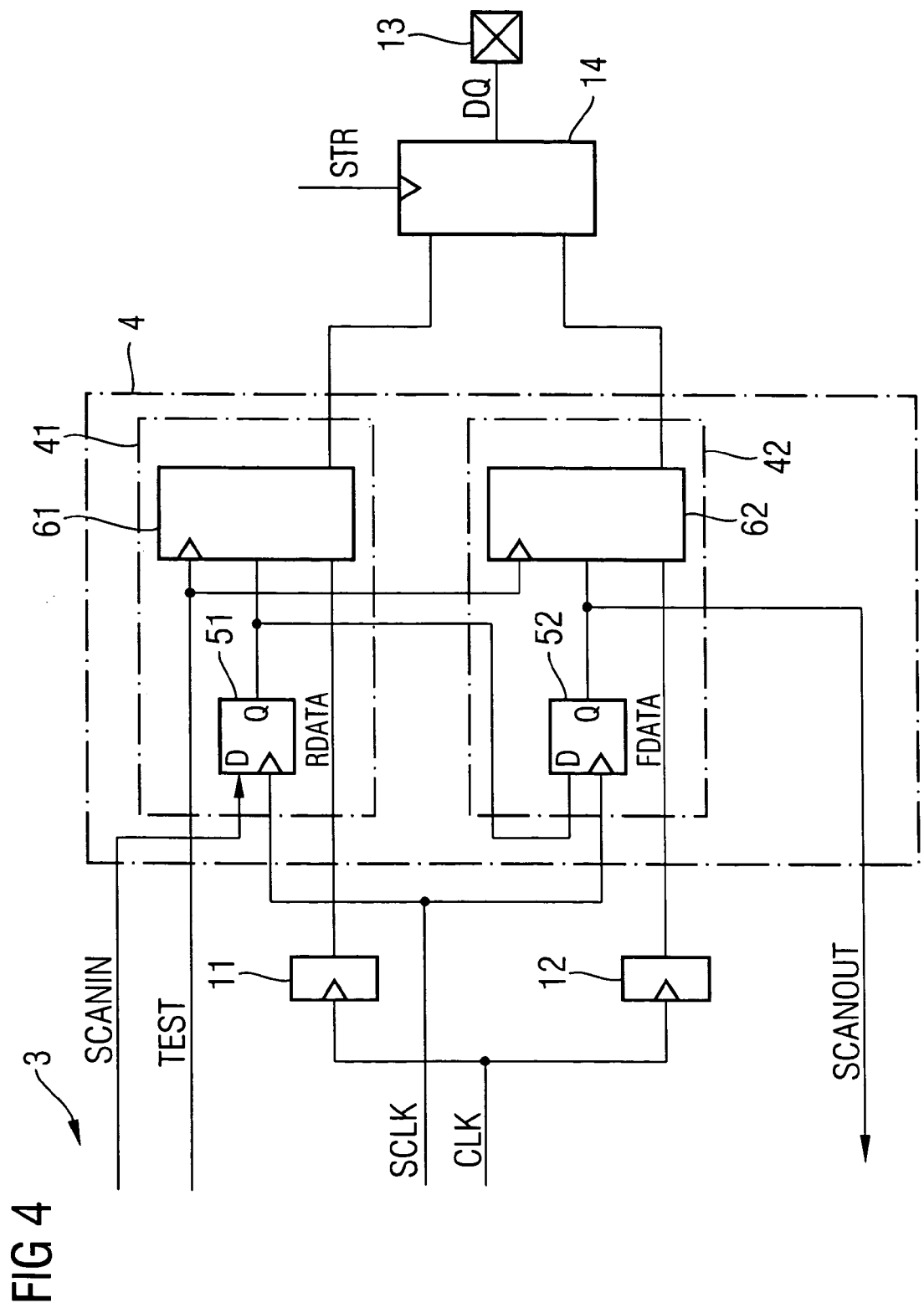
FIG. 4 illustrates a schematic diagram of a circuit arrangement containing register elements and data selectors according to an exemplary embodiment of the present invention.

FIG. 4 illustrates a further exemplary embodiment of the present invention comprising a circuit arrangement for selecting and outputting data signals of a semiconductor memory device. An output circuit 14, having output drivers, is in this case formed in a manner such as is customary for DRAMs with a DDR-IF. Under the control of pulses of a strobe signal STR at a strobe input of output circuit 14, in each case one of two input signals to output circuit 14 is passed to an output of the output circuit 14 that is connected to data signal terminal 13. By means of a clock signal or memory clock CLK, memory data signals RDATA, FDATA are read from memory cells 11, 12 of the semiconductor memory device. In this embodiment, scan chain 4 has two scan elements 41, 42. In this exemplary embodiment, each scan element 41, 42 comprises data selectors 61, 62 and register elements 51, 52 similar to a D-type flip-flop in each case. A data input of the first register element 51 is connected to a test data source 3, which outputs a scan data signal SCANIN. Register elements 51, 52 are cascaded in series, where a data output of first register element 51 is passed to the data input of second register element 52. Scan chain 4 is extended in a simple manner for testing further output circuits 14 of the semiconductor memory device by the output of second register element 52 connecting to the input of the register element of a further scan element 41 assigned to a further output circuit 14 of semiconductor memory device 1. Register elements 51 are clocked by a scan clock signal SCLK generated by test source 3. In each case the data output of a register element 51, 52 and an output of one of the memory cells 11, 12 are passed to the two inputs of a data selector 61, 62. In a manner dependent on a test mode signal TEST, likewise controlled by test source 3, in each case either a test data signal derived from the scan data signal SCANIN or the memory data signal RDATA, FDATA present at the same data selector 61, 62 is then passed to the output of the data selector 61, 62 and thus to the input of output circuit 14.

Figure 5:
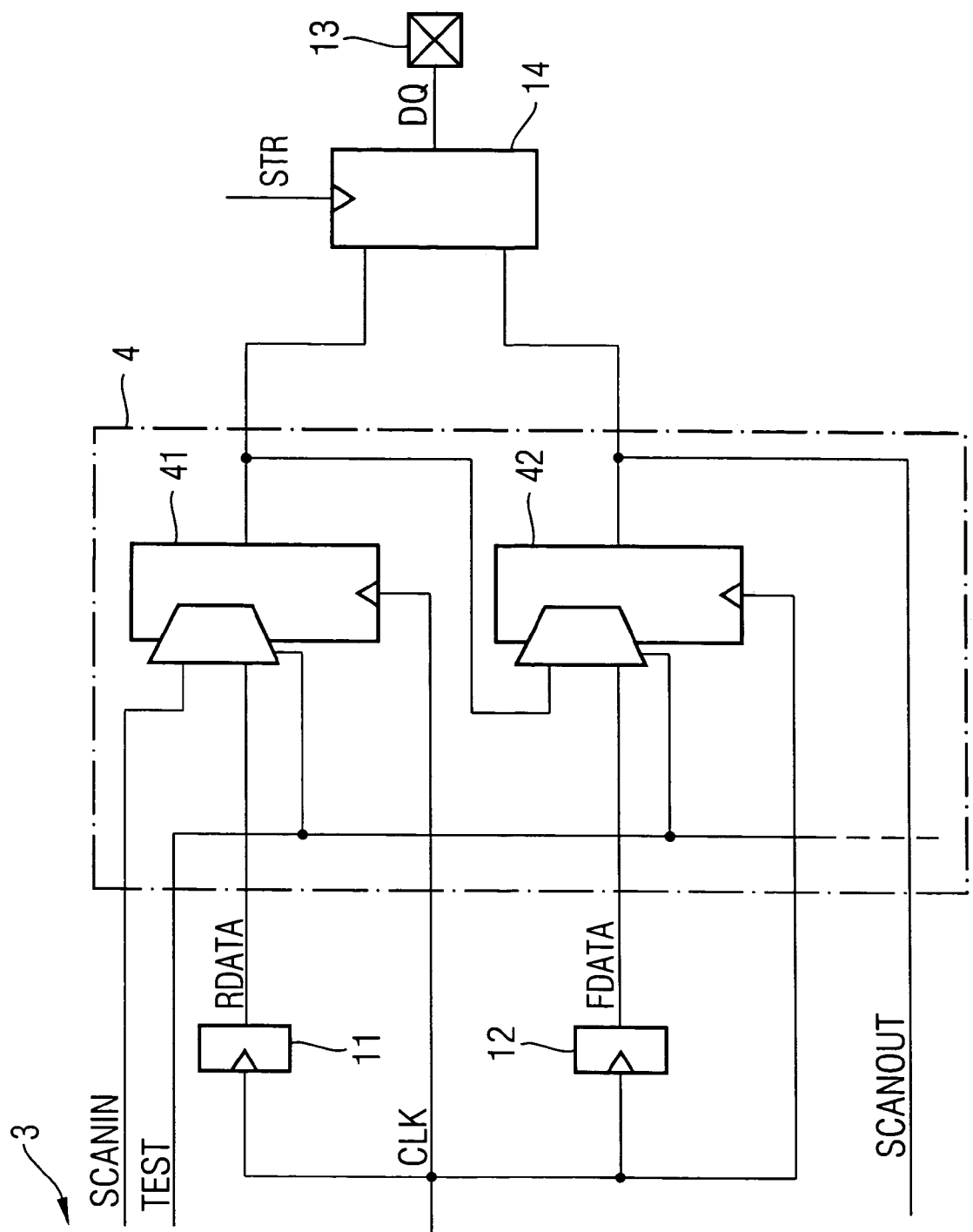
FIG. 5 illustrates a schematic diagram of a circuit arrangement containing multiplex scan elements according to an exemplary embodiment of the present invention.

In another embodiment of the present invention, as illustrated in FIG. 5, scan chain 4 differs from the scan chain described in FIG. 4 by virtue of the fact that the input of a register function of the scan elements 41, 42 is selected by the test mode signal TEST.

Figure 6:
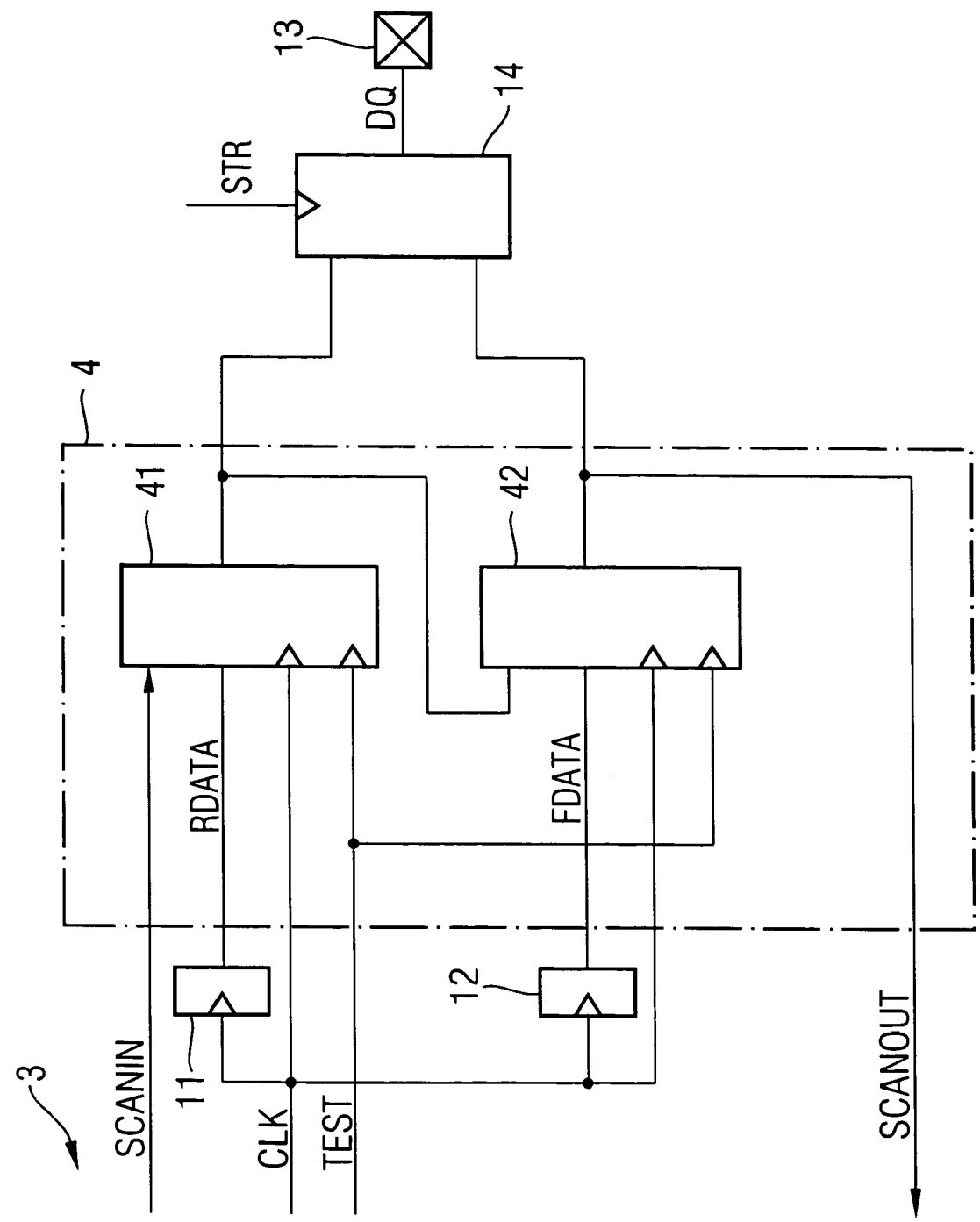
FIG. 6 illustrates a schematic diagram of a circuit arrangement containing double clocked register elements according to an exemplary embodiment of the present invention.

In the design of scan chain 4 according to a further exemplary embodiment illustrated in FIG. 6, each scan element 41, 42 has two clock inputs, one clock signal CLK at a first clock input switching through a memory data signal RDATA, FDATA present at a first input, and a second clock signal TEST at the second clock input switching through a test data signal present at the second input to the output of the scan element 41, 42.

Figure 7:
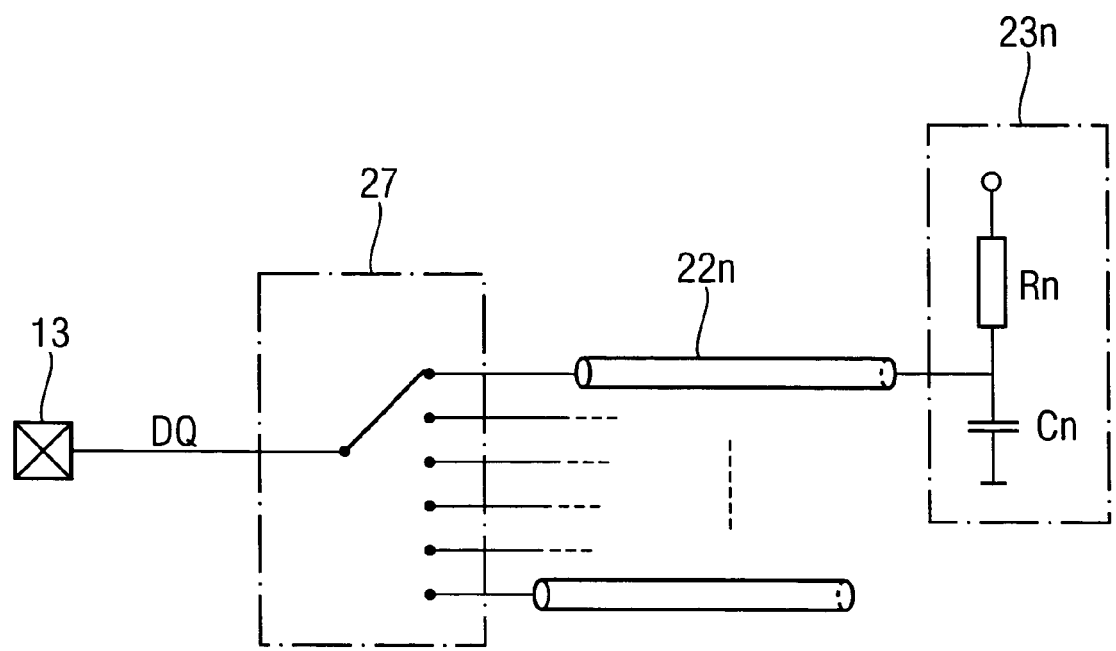
FIG. 7 illustrates a schematic diagram of a detail from a test arrangement according to another exemplary embodiment of the present invention.

FIG. 7 diagramatically illustrates a detail of a test arrangement according to a further exemplary embodiment of the present invention. A data signal terminal 13 of a semiconductor device, at which terminal a data signal DQ is output, is connected to a distributor device 27. Using a distributor device 27, the data signal DQ is passed to one of a plurality of test circuitries 22n, 23n. In this case, each test circuitry 22n, 23n represents a load—corresponding to a later application of the semiconductor memory device—with a connecting line 22 and a load simulation 23 of an input of the application memory controller used in the application. In this example, a simulation of an input of an application memory controller in each case comprises a resistance Rn and also a capacitance Cn.

Accordingly, exemplary embodiments of the present invention obviate the need to provide test data signals from a memory cell array and thus also the need to write to the memory cell array for characterizing the output circuits or the output drivers assigned to the output circuits. Furthermore, there is no need for a temporary connection between a test memory controller and the semiconductor memory devices to be tested via the data bus. The data bus is advantageously formed in uncorrupted fashion in accordance with the application and does not contain any additional elements extraneous to the application which corrupt a test or characterization of the output circuits. The test sequence is therefore simplified.

Furthermore, a test construction is adapted to a plurality of application memory controllers provided for a later application in a simple manner solely through provision of the load simulations thereof. Complex programming of the respective application memory controllers for test purposes or for characterizing the output drivers of the semiconductor memory devices is obviated. Independently of the type of application memory controller, the testing requires only the test memory controller, which can be chosen independently of the application memory controller.

Preferably, the semiconductor memory devices to be tested, in the configuration to be tested, are connected to the test memory controller via a control bus and an address bus for transferring control and address signals, respectively. A data bus for transferring data signals is in each case connected to test circuitry which simulates an application memory controller with regard to the loading of a data signal and also a line portion between the semiconductor memory device and the application memory controller. For testing, the semiconductor memory device or a plurality of semiconductor memory devices interconnected to form a configuration to be tested is/are operated in a test mode by means of the test memory controller.

As an alternative to this, the test data signals are read in and a test mode is controlled via additional terminals of the semiconductor memory device. Preferably, a test interface (TAP, test access port) already provided for other test purposes is used for this purpose.

Preferably, the test data signals are read serially into a scan chain formed from at least two cascaded scan elements with a register function. The outputs of the scan elements are then connected to the inputs of the output circuits during the characterization of the output circuits.

The data signals are evaluated for instance by the recording of a data eye. For this purpose, by way of example, measurement signals are coupled out in a manner free of repercussions at the inputs of the load simulation by means of a measuring head and fed to the test data evaluation device. Furthermore, in the test data evaluation device, the data signals are evaluated by a bit error rate being determined by means of a bit error counter.

Moreover, circuit arrangements provided by other embodiments of the present invention make it possible to measure the data signals output by the output circuits without requiring a writing access to the semiconductor memory device via the data signal terminals. A semiconductor memory provided with such a circuit arrangement can consequently be tested in a test environment in which it is possible to authentically simulate a loading of the output drivers of the output circuit in an application in a simple manner.

In order to apply a scan data signal to the scan elements, the scan elements are provided with a register function in each case and are connected up serially to form a scan chain. The scan elements of the scan chain serially take up a scan data signal and output it in parallel to the inputs of the output circuit or output circuits as a respective test data signal.

Preferably, the scan elements in each case comprise a register element and a data selector. The register elements of the scan elements forming the scan chain, for instance D-type flip-flops, are serially cascaded. The scan data signal is serially read into the register elements and the test data signals respectively assigned to an input are passed from the outputs of the register elements in parallel to the data selectors. In addition, the memory data signals generated by the memory cells are also passed in each case to one of the inputs of one of the data selectors. In a manner dependent on a test mode signal, either the respectively assigned memory data signal or the respectively assigned test data signal is assigned to one of the inputs of the output circuit.

In another embodiment of the present invention, the scan elements are embodied as multiplex register elements. Each multiplex register element has two data inputs that can be selected by a test mode signal of the test data source. A memory data signal of a memory cell is passed to a first data input of the multiplex register elements and a test data signal of the test data source derived from the scan data signal that is looped serially through the scan chain is passed to the second data input.

In yet another embodiment of the present invention, the scan elements are in each case formed as doubly controlled register elements. In this case, a first, usually pulsed, clock signal at a first input may be used to switch a memory data signal of one of the memory cells. The memory data signal is passed to a first data input of the scan element. Alternatively, a second, usually pulsed, clock signal at the second clock input may be used to switch a test data signal of the test data source that is present at a second data input, thereby switching the test data signal to a data output of the scan element and thus to the assigned input of the output circuit.

A suitable test data source that outputs both the scan data signals and a test mode signal and, as required, a scan clock signal for clocking the scan chain, may comprise a test data generator provided as part of a self-test apparatus that is usually provided in a semiconductor memory device. Alternatively, the test data source may comprise a serial test interface of the semiconductor memory device to be tested. Optionally, the serial test interface may be formed as a standardized serial test interface for semiconductor memory devices mounted on printed circuit boards (boundary scan).

The test arrangement provided by embodiments of the present invention makes it possible to test the output drivers of the output circuits in terms of their timing behavior without accessing a memory cell array of the semiconductor memory devices. This obviates the need to connect the data signal terminals of the semiconductor memory devices to be tested even only temporarily to a test memory controller and to release the connection again once test data have been read into the memory cell array of the semiconductor memory devices. This furthermore obviates the need to provide at the data signal terminals an apparatus which enables the data signal terminal to be temporarily connected to a test memory controller for writing to the memory cell array of the semiconductor memory devices.

Preferably, the data signal terminals of the semiconductor memory devices are assigned in each case by a distributor device to one of a plurality of different test circuitries. The test arrangement is suitable in particular for testing semiconductor memory devices which have comparatively stringent requirements with regard to their output circuits.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method for testing output circuits connected to a plurality of memory cells in a semiconductor memory device, comprising:
   disconnecting inputs of the output circuits from the memory cells;
   connecting the respective inputs of the output circuits to outputs of scan elements controlled by a test data source, wherein test data signals are generated by the test data source and are passed to the inputs of the output circuit via the scan elements;
   connecting the output circuits to a test data evaluation device via a data signal terminal;
   applying test data signals from a test data source to inputs of the output circuits; and
   evaluating output data signals that are output by the output circuit to the data signal terminal using the test data evaluation device.

2. The method of claim 1, wherein a control bus and an address bus for transferring control and address signals of the semiconductor memory device are connected to a test memory controller, and wherein the test data source is controlled by means of the test memory controller.

3. The method of claim 1, wherein the test data signals are read serially into a scan chain containing at least two cascaded scan elements, and wherein the test data signals are output in parallel to the inputs of the output circuits.

4. The method of claim 1, wherein data eyes of the data signal are recorded by the test data evaluation device.

5. The method of claim 1, wherein the test data evaluation device detects bit error rates of the data signals with regard to a respectively assigned test data signal.

6. A circuit arrangement for selecting and outputting a data signal of a semiconductor memory device, comprising:
   an output circuit connected to a data signal terminal of the semiconductor memory device and to at least two memory cells, wherein a memory data signal output by one of the at least two memory cells is driven onto the data signal terminal in a manner dependent upon a data strobe signal; and at least two scan elements that connect in each case one of the inputs of the output circuit to a scan data signal generated by a test data source in a test mode and to one of the memory data signals of the memory cells in an application mode.

7. The circuit arrangement of claim 6, further comprising a scan chain that is formed from at least two scan elements and serially takes up the scan data signal and outputs it in parallel to the inputs of the output circuits.

8. The circuit arrangement of claim 7, wherein the scan elements in each case comprise a register element and a data selector, wherein the register elements of the scan chain are serially cascaded and wherein outputs of the register elements are in each case passed to the data selectors.

9. The circuit arrangement of claim 8, wherein in each case either the respectively assigned memory data signal or the test data signal respectively fed via an assigned register element, is assigned to one of the inputs of the output circuit by means of the data selectors in a manner dependent on a test mode signal.

10. The circuit arrangement of claim 7, wherein the at least two serially cascaded scan elements are configured in each case as a multiplex register element containing two data inputs that can be selected by a test mode signal generated by the test data source, wherein a memory data signal of one of the memory cells is passed to a first data input of the multiplex register element, and wherein a scan data signal of the test data source is passed serially through the scan chain to the second data input.

11. The circuit arrangement of claim 7, wherein the at least two serially cascaded
scan elements are configured in each case as doubly controlled register elements, wherein a first clock signal can be used to switch a memory data signal of one of the memory cells, said memory data signal being passed to a first data input of the scan element, and wherein a second clock signal is configured to switch a test data signal of the test data source present at a second data input, to a data output of the scan element.

12. The circuit arrangement of claim 6, wherein the test data source is formed as part of an internal self-test device of the semiconductor memory device.

13. A test arrangement for testing output circuits in a semiconductor memory device, with each output circuit is assigned to at least one memory cell, comprising:

test circuitry containing a load simulation of an application memory controller and a connecting line corresponding to a line portion between the application memory controller and the semiconductor memory device;

scan elements that connect at least one input of an output circuit to a scan data signal generated by a test data source; and a test memory controller connected to control signal terminals of the semiconductor memory device for controlling operation of the semiconductor memory device in a test mode.

14. The circuit arrangement of claim 13, wherein a data signal terminal is in each case exclusively connected to the test circuitry, and wherein the data signal terminal is connected to an output of the output circuit.

15. The test arrangement of claim 14, further comprising a distributor device that assigns a data signal terminal to one of a plurality of different test circuitries.

16. A circuit architecture for processing a data signal of a semiconductor memory device, comprising:

a test data source for generating a scan data signal;

at least two scan elements each connected to the test data source and to at least two memory cells within the semiconductor memory device;

an output circuit connected to at least two memory cells within the semiconductor memory device, wherein a memory data signal output by one of the at least two memory cells is driven onto the data signal terminal in a manner dependent on a data strobe signal; and a data signal terminal of the semiconductor memory device connected to the output circuit, wherein the scan elements send a scan data signal generated by the test data source to the output circuit during operation in a test mode, and wherein the scan elements send a memory data signal generated by a memory cell during operation in application mode.

17. The circuit architecture of claim 16, wherein the at least two scan elements further comprise a scan chain containing serially cascaded scan elements.

* * * * *